United States Patent [19]

Sato et al.

[11] Patent Number: 4,839,868

[45] Date of Patent: Jun. 13, 1989

[54] SEMICONDUCTOR MEMORY DEVICE HAVING SENSE AMPLIFIERS WITH DELAYED AND STOPPED DRIVE TIMES

[75] Inventors: Kimiaki Sato, Tokyo; Tool Khono, Kawasaki, both of Japan

[73] Assignee: Fujitsu Limited, Kanagawa, Japan

[21] Appl. No.: 95,199

[22] Filed: Sep. 11, 1987

[30] Foreign Application Priority Data

Sep. 18, 1986 [JP] Japan ................................ 61-218170

[51] Int. Cl.⁴ ..................... G11C 7/00; G11C 8/00; G01R 19/00
[52] U.S. Cl. ................... 365/230.06; 365/189.04; 365/205; 365/233; 365/189.05; 365/230.09; 307/530
[58] Field of Search ............... 365/233, 194, 205, 207, 365/208, 190, 154, 156, 230, 189; 357/42; 307/530

[56] References Cited

U.S. PATENT DOCUMENTS

| | | | |
|---|---|---|---|
| 4,460,998 | 7/1984 | Yamada et al. | 365/200 |
| 4,511,997 | 4/1985 | Nozaki et al. | 365/189 X |
| 4,546,457 | 10/1985 | Nozaki et al. | 365/230 X |
| 4,596,001 | 6/1986 | Baba | 365/189 X |
| 4,730,280 | 3/1988 | Aoyama | 365/205 X |

FOREIGN PATENT DOCUMENTS

| | | | |
|---|---|---|---|
| 0166642 | 1/1986 | European Pat. Off. | 365/205 |
| 59-101095 | 6/1984 | Japan | 365/194 |
| 2127246 | 4/1984 | United Kingdom | 365/233 |

Primary Examiner—Stuart N. Hecker
Assistant Examiner—Alfonso Garcia
Attorney, Agent, or Firm—Armstrong, Nikaido, Marmelstein & Kubovcik

[57] ABSTRACT

A semiconductor memory device includes a write data transfer unit; a plurality of groups of sense amplifiers; a plurality of word lines; and a plurality of pairs of bit lines. Each of the pairs of bit lines includes a pair of inside bit lines, extending between the write data transfer unit and each of the sense amplifiers, and a pair of outside bit lines, extending from each of the sense amplifiers to the side opposite the side of the write data transfer unit. A plurality of memory cells is connected between the word lines and the pairs of bit lines, respectively. The drive timing of a selected one of the groups of sense amplifiers, connected to the selected one of pairs of bit lines on which the transfer of the write data is being performed, is delayed when compared with the drive timing of the sense amplifiers connected to the remaining pairs of bit lines on which the transfer of the write data is not being performed. The write data is transferred from the write data transfer unit to a part of the memory cells connected to a selected one of outside bit lines connected to the selected one of the groups of sense amplifiers. Further, it is also possible to stop the drive of the selected one of the groups of sense amplifiers connected to the selected one of pairs of bit lines on which the transfer of the write data is being performed, instead of delaying the drive timing of the selected one of the groups of sense amplifiers.

13 Claims, 8 Drawing Sheets

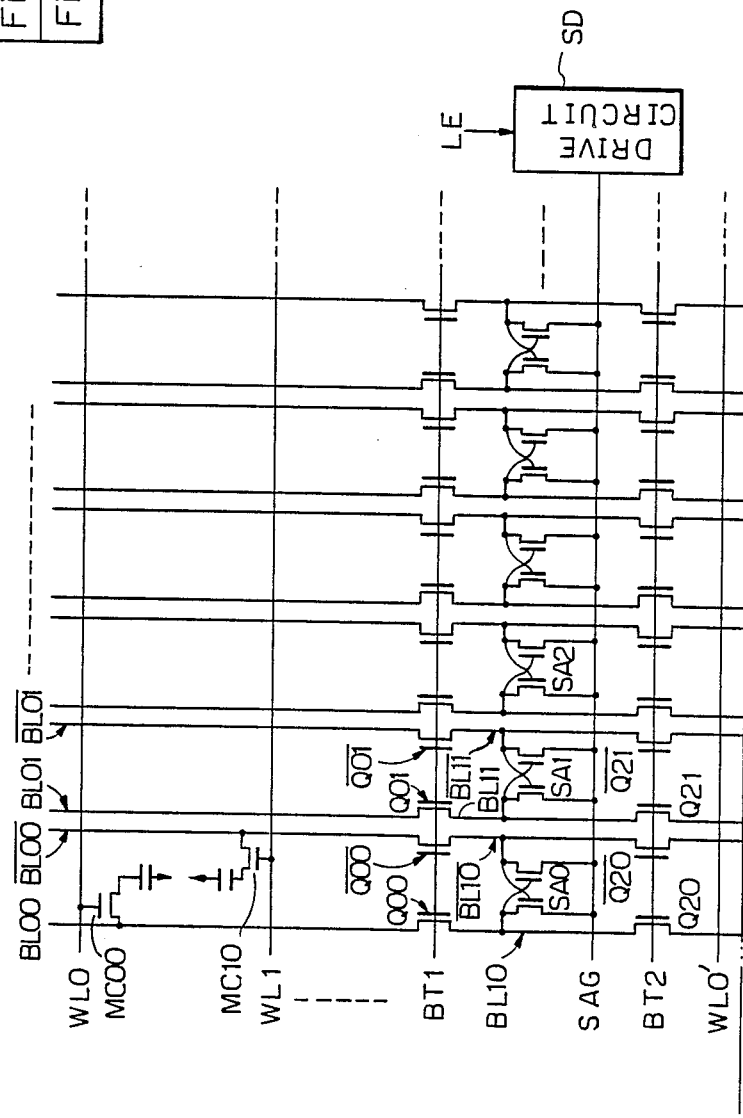

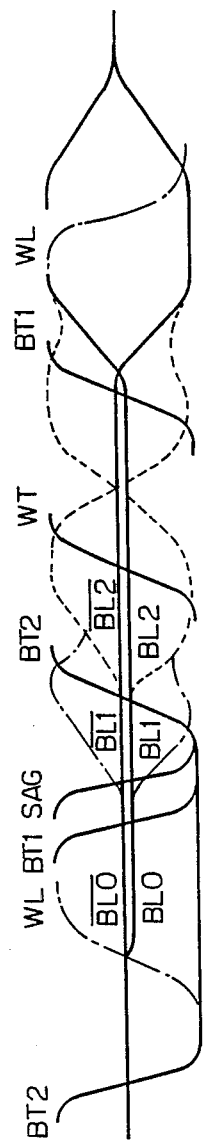
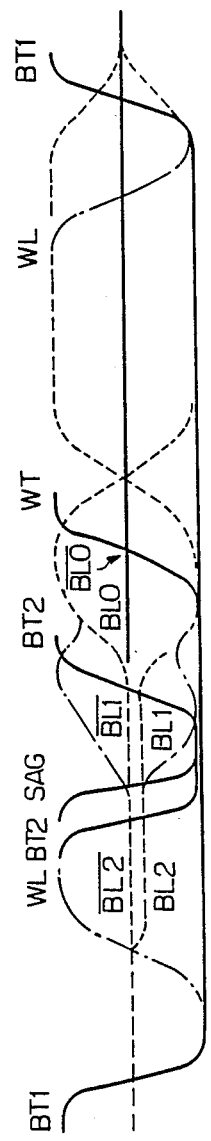
Fig. 2 (a) PRIOR ART
Fig. 2 (b) PRIOR ART

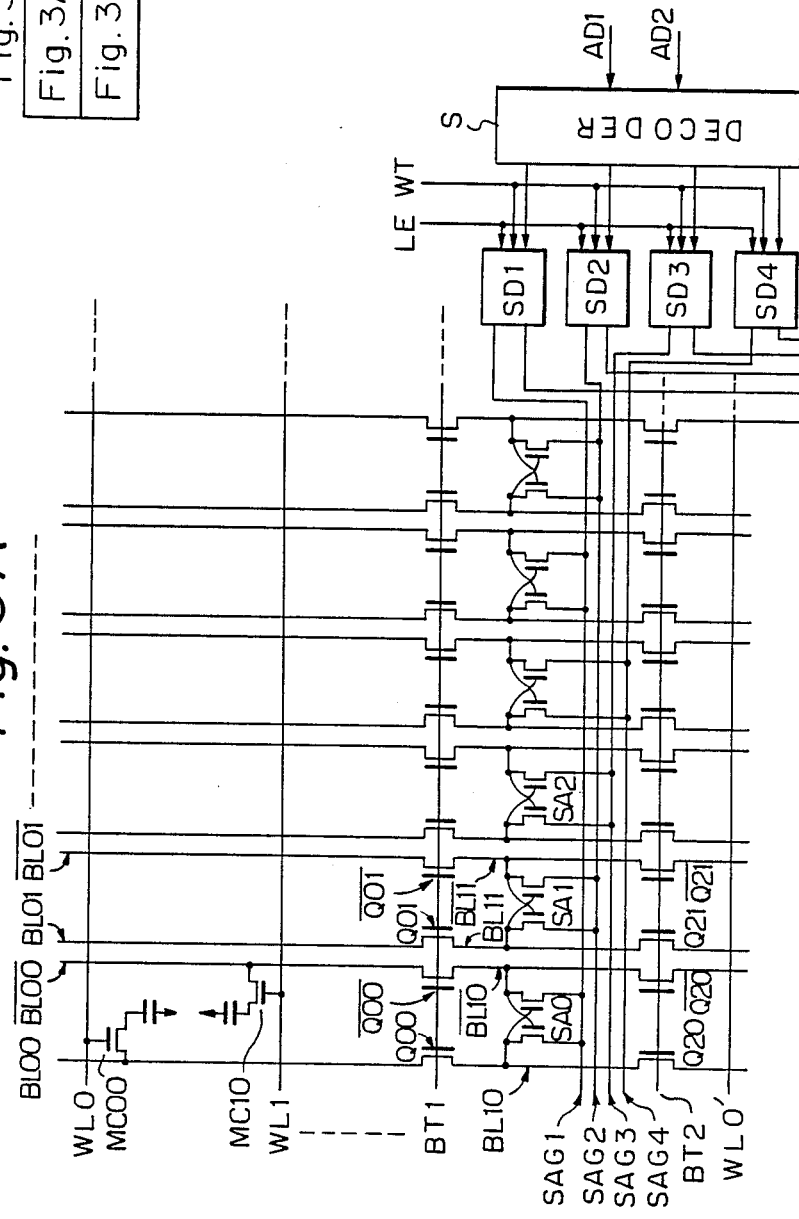

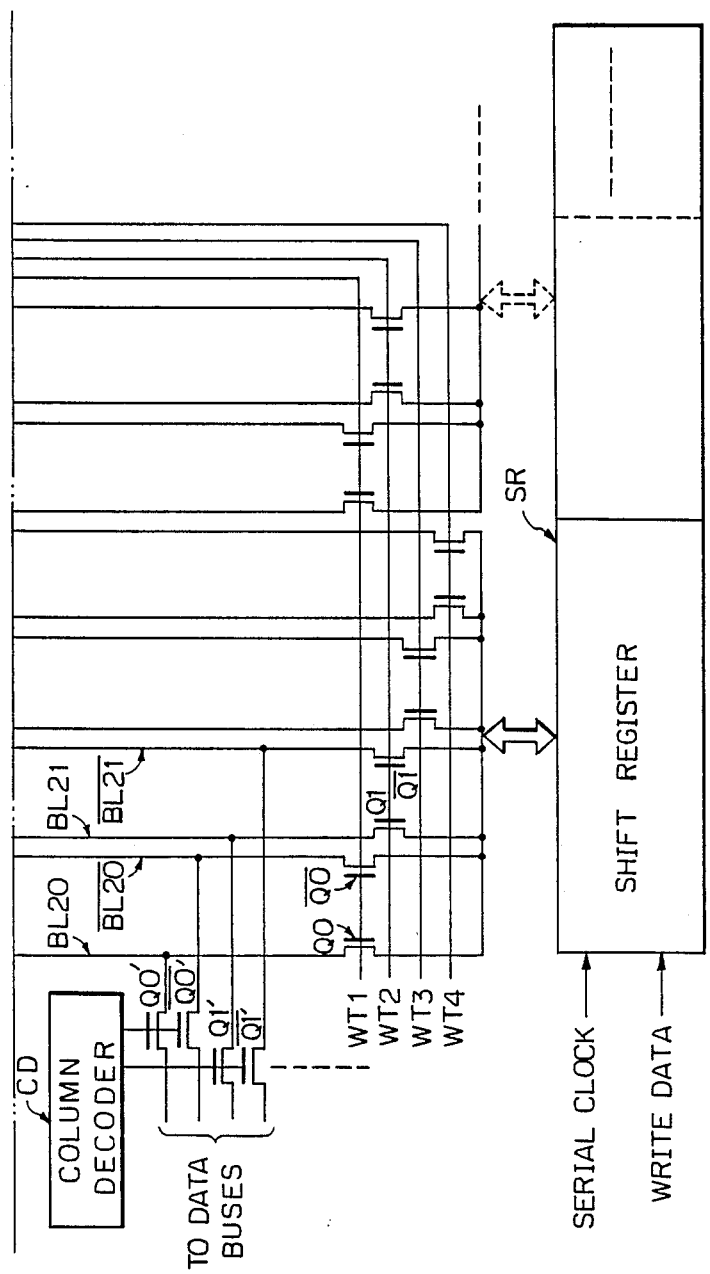

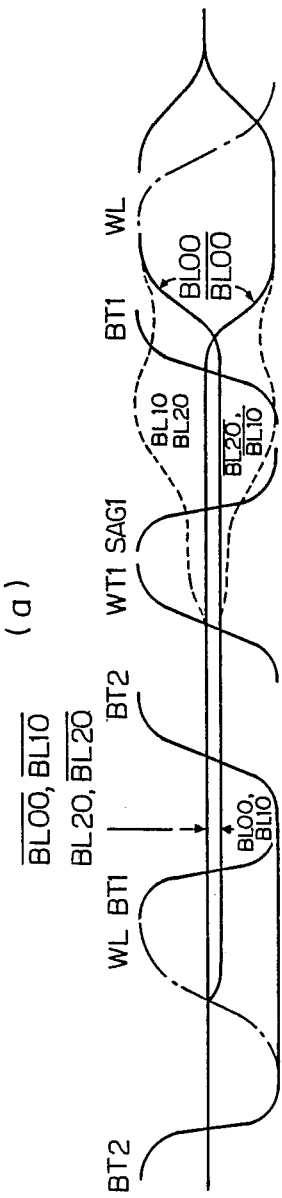
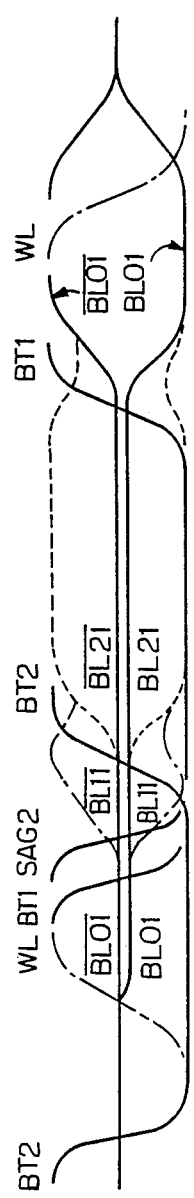
Fig. 5 (a)
Fig. 5 (b)

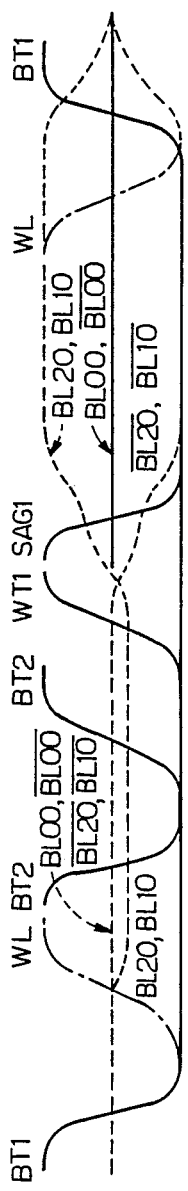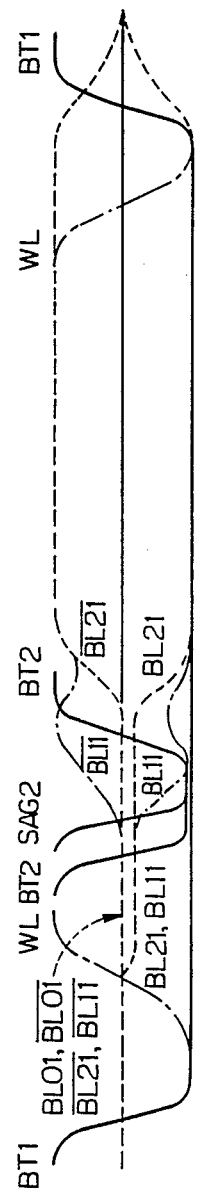
Fig. 6(a)
Fig. 6(b)

SEMICONDUCTOR MEMORY DEVICE HAVING SENSE AMPLIFIERS WITH DELAYED AND STOPPED DRIVE TIMES

BACKGROUND OF THE INVENTION

1. Field of the Invention

This invention relates to a semiconductor memory device having shared bit lines. More particularly, this invention relates to a semiconductor memory device having a plurality of pairs of shared bit lines connected to a SAM type (serial access memory type) read/write system, for example, as used in a video RAM, from which a system data write operation can be carried out to memory cells connected to a selected word line and a selected one of groups of pairs of shared bit lines.

2. Description of the Related Art

Recent increases in the capacities of the semiconductor memory devices has necessitated a corresponding increase in the length of the bit lines. As a result, the stray capacitance of the bit lines to which the selected memory cells are connected can no longer be neglected with respect to the capacitance comprising the memory cells. In this case, considering, for example, an input of data of a memory cell into a corresponding sense amplifier, a slight potential change from the precharge potential is created between the corresponding pairs of bit lines and is amplified by the corresponding sense amplifier. However, as mentioned above, if the stray capacitance of the bit lines is increased, such a slight potential change cannot be satisfactorily created.

Therefore, in the prior art, there has been proposed a semiconductor memory device comprising a plurality of sense amplifiers, a plurality of word lines, a plurality of pairs of shared bit lines, each of the pairs of shared bit lines comprising a pair of inside bit lines extending between the read/write system (e.g., a shift register used in the above SAM type read/write system) and each of the sense amplifiers, and a pair of outside bit lines extending from each of the sense amplifiers to the side opposite to the side of the read/write system, and a plurality of memory cells connected between each of the word lines and each of the pairs of shared bit lines.

Thus, when data in the memory cells connected to the selected word line and the outside bit lines is input to the corresponding sense amplifiers, the inside bit lines are disconnected from the corresponding sense amplifiers by turning OFF the corresponding transfer gates provided between each of the sense amplifiers and each pair of the inside bit lines, so that the stray capacitance of the inside bit lines does not affect the above potential change due to the cell data between the corresponding pair of outside bit lines. Similarly, when data in the memory cells connected to the selected word line and the inside bit lines is input to the corresponding sense amplifiers, the outside bit lines are disconnected from the corresponding sense amplifiers by turning OFF the corresponding transfer gates provided between each of the sense amplifiers and each pair of the outside bit lines. Accordingly, when predetermined data is written from each stage of the shift register into all of the memory cells connected to a selected word line through each pair of bit lines (through each column), all of the sense amplifiers can be driven at the same timing (i.e., before the write data is transferred from the write data transfer means such as the shift register to each pair of bit lines, or after the write data is transferred from the write data transfer means to each pair of bit lines).

However, instead of writing data into all memory cells connected to a selected word line as above-mentioned, sometimes it is necessary to write data only into a part of the memory cells connected to the selected word line. In this case, predetermined data is written from each stage of the shift register into only part of the memory cells connected to the selected word line by selecting one of a plurality of groups of the bit line pairs (by selecting one of a plurality of groups of columns). In such a case, the data write operation can be performed only from each stage of the shift register to the memory cells connected to the selected one of the groups of columns and a read refresh operation is required for the memory cells connected to the remaining groups of the columns where the data write operation is not performed. Namely, the above read refresh operation is required for the memory cells connected to the columns where the data write operation is not performed, by which read refresh operation data stored in the memory cells connected to the columns where the data write operation is not performed is once amplified by the corresponding sense amplifiers, and then the amplified data is rewritten to each of the corresponding memory cells.

In this connection, essentially no problems arise in such a partial write operation for the selected part of memory cells connected to the selected word line and the selected one of groups of pairs of inside bit lines, even if the drive timing of the sense amplifiers belonging to the columns where the data write operation is performed is the same as the drive timing of the sense amplifiers belonging to the columns where the data write operation is not performed (i.e., the read refresh operation is performed).

On the other hand, when the data write operation is carried out for the selected part of memory cells connected to the selected word line and the selected one of groups of pairs of outside bit lines, it is necessary to turn ON the transfer gates provided between each of the sense amplifiers and each pair of the inside bit lines. However, if the above transfer gates are turned ON in order to carry out the above partial write operation before the sense amplifiers are driven, it becomes difficult to create sufficient correct cell data on the corresponding pair of outside bit lines and thus to amplify the above cell data by using the sense amplifiers. This is due to the large stray capacitance including the stray capacitance of the inside and the outside bit lines, which stray capacitance can no longer be neglected with respect to the capacitance comprising each memory cell. Thus, it is necessary to create sufficient cell data on the corresponding pair of outside bit lines while the transfer gates are cut OFF, and thus the length of each pair of bit lines is reduced by a half, to reduce the stray capacitance of each pair of bit lines to by a half. In other words, it is necessary to turn ON the above transfer gates after the cell data created on the corresponding pair of outside bit lines is amplified by the corresponding sense amplifiers, in order to prevent destruction of the cell data created between the pair of outside bit lines corresponding to the columns where the data write operation is not performed (the read refresh operation is performed) from by noise.

However if the write data is transferred to the selected one of the groups of columns where the data write operation is performed after the cell data created on the corresponding pair of outside bit lines is amplified by the corresponding sense amplifiers, a large potential difference due to the cell data is created between the pair of outside bit lines through which the data write operation is performed.

Therefore, in such a case, a problem arises in that it is necessary to provide a very large write amplifier on the write data transfer means side (i.e., the shift register side). Thus, in practice, and considering the requisite area, it has been impossible to perform the above partial write operation, especially into a part of the memory cells connected to the selected word line and the selected one of the groups of outside bit line pairs.

SUMMARY OF THE INVENTION

The present invention was made to solve the above problems, and the main object of the present invention is to ensure the read refresh operation for each memory cell connected between a selected word line and each of the nonwritten columns and to perform the data write operation for each memory cell connected between a selected word line and each of the columns through which the write data is transferred without using such a large write amplifier on the write data transfer means side, especially when the above partial data write operation is performed to the memory cells connected to a selected one of groups of outside bit lines.

To attain the above-mentioned object, according to one aspect of the present invention, there is provided a semiconductor memory device including a write data transfer device; a plurality of groups of sense amplifiers; a plurality of word lines; a plurality of pairs of bit lines, each of the pairs of bit lines including a pair of inside bit lines extending between the write data transfer device and each of the sense amplifiers, and a pair of outside bit lines extending from each of the sense amplifiers to the side opposite to the side of the write data transfer device; a plurality of memory cells connected between the word lines and the pairs of bit lines, respectively; and a device for delaying the drive timing of a selected one of the groups of sense amplifiers connected to a selected one of the pairs of bit lines on which the transfer of the write data is being performed, compared with the drive timing of the sense amplifiers connected to remaining pairs of bit lines on which the transfer of the write data is not being performed, when the write data is transferred from the write data transfer means to part of the memory cells connected to a selected one of outside bit lines connected to the selected on of the groups of sense amplifiers.

Further, according to another aspect of the present invention, it is also possible to stop the drive of the selected one of the groups of sense amplifiers connected to the selected one of pairs of bit lines on which the transfer of the write data is being performed, instead of delaying the drive timing of the above selected one of the groups of sense amplifiers, as above-mentioned.

Thus, considering the partial write operation of the memory cells belonging to the selected one of the groups of outside bit lines, the sense amplifiers connected to the nonwritten columns are driven while the above transfer gates are cut OFF (i.e., when the length of each pair of bit lines is reduced by a half). At that time, the selected group of sense amplifiers connected to the write data transfer columns is not yet driven, and thus a large voltage difference due to the corresponding cell data is not yet created in each of the columns through which the write data is transferred.

Then, the above transfer gates are turned ON, to transfer the write data from each stage of the shift register to each of the columns where the data write operation is performed.

In this connection, with regard to the columns where the data write operation is not performed (i.e., the read refresh operation is performed), the cell data created on the corresponding columns has been already amplified by the corresponding sense amplifiers, and a sufficient voltage difference has been already created in each of the nonwritten columns.

Then, the write data is transferred from the write data transfer means (e.g., from each stage of the shift register) to each of the columns where the data write operation is performed, and subsequently, the selected one of the groups of sense amplifiers connected to the columns where the write data has been transferred are driven, and thus the amplified data is written to each of the memory cells connected to the columns where the data write operation is performed, and to the selected word line.

In this connection, the drive of the above selected one of the groups of sense amplifiers may be stopped, if necessary.

Thus, even when the data write operation is performed into the memory cells connected to the selected word line and the selected group of pairs of the outside bit lines, the read refresh operation is ensured in each of the nonwritten columns, and the data write operation from the write data transfer means is performed in each of the columns where the write data is transferred, without using a large write amplifier on the write data transfer means side.

BRIEF DESCRIPTION OF THE DRAWINGS

FIGS. 1 and 1A–1B are a circuit diagram showing an example of the constitution of a conventional shared bit line type semiconductor memory device;

FIGS. 2(a)–2(b) are a view showing potential changes when writing data in the outside bit lines and the inside bit lines in the circuit shown in FIGS. 1A and 1B;

FIGS. 3 and 3A–3B are a circuit diagram showing an example of the constitution of a semiconductor memory device according to an embodiment of the present invention;

FIGS. 5(a)–5(b) are a view showing potential changes when writing data into part of the memory cells connected to a selected group of the pairs of outside bit lines in the circuit shown in FIGS. 3A–3B; and FIGS. 6(a)–6(b) are a view showing potential changes when writing data into part of the memory cells connected to a selected group of the pairs of inside bit lines in the circuit shown in FIGS. 3A–3B.

DESCRIPTION OF THE PREFERRED EMBODIMENTS

Figure 1B:
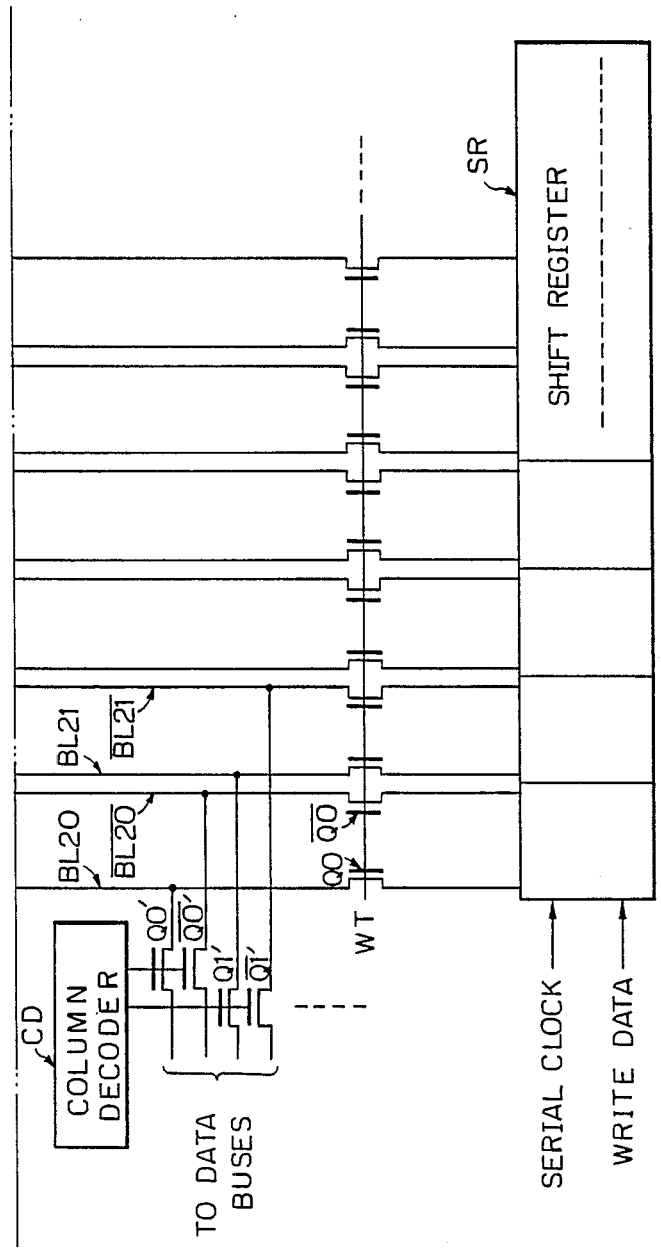

To clarify the background of the present invention, an example of a conventional shared bit line type semiconductor memory device is shown in FIGS. 1A–1B. Namely, FIGS. 1A–1B shows, as an example of a conventional shared bit line type semiconductor memory device. The shared bit line type dynamic memory construction has a two-port read/write system comprised of a RAM system (random access memory system) and SAM system (serial access memory system). WL0, WL1, ... WL0', ... are word lines, and $\overline{BL00}$, BL01, BL01, ... and BL20, $\overline{BL20}$, BL21, $\overline{BL21}$, ... are outside and inside (a side where the write data transfer means is provided) bit lines, predetermined memory cells (MC00, MC10, etc.) being formed at predetermined locations among the intersections formed by the word lines and the outside and inside bit lines (for example, the intersection of WL0 and BL00, the intersection of WL1 and $\overline{BL00}$ etc.). Note that, for the bit lines, intermediate bit lines (for example, BL10) are provided between the above-mentioned outside and inside bit lines (for example, BL00 and BL20), and bit line transfer gates Q00 and Q20 are connected between the outside bit lines (for example, BL00) and the intermediate bit lines (for example, BL10) and the intermediate bit lines (for example, BL10) and the inside bit lines (for example, BL20), whereby the bit lines are shared into three bit line portions. A sense amplifier SA0 is connected to the intermediate bit lines BL10 and $\overline{BL10}$, a sense amplifier SA1 is connected to the next intermediate bit lines BL11 and $\overline{BL11}$, and so on in sequence.

The read/write system of the RAM system is provided with a well-known column decoder CD. When a word line WL0 is selected by a row decoder not shown, and, for example, column gates Q0' and $\overline{Q0'}$ are turned ON by an output signal of the column decoder, the bit lines BL00 and $\overline{BL00}$ are selected via the pair of bit lines BL20 and $\overline{BL20}$, whereby a predetermined memory cell MC00 is selected and a read operation of the data from the memory cell MC00 or a write operation of the data to the memory cell MC00 is performed through the column gates Q0' and $\overline{Q0'}$. In this case, the semiconductor memory device operates as a RAM.

On the other hand, the SAM type read/write system is provided with a shift register SR (or registers of a plurality of bits connected to data buses) for reading out and storing all at once data from all of the memory cells connected to a selected word line and each pair of bit lines and for sequentially outputting the data based on a serial clock (or sequentially storing the write data for all of the memory cells based on the serial clock and writing the stored write data into all of the memory cells all at once). In this case, the semiconductor memory device operates through a SAM system data transfer device. This is particularly suited for high speed access. Note that WT is a control signal line for controlling the ON/OFF state of the transfer gates Q0, $\overline{Q0}$, ... on the side of the SAM system.

Recent increases in memory capacities has necessitated a corresponding increase in the length of the bit lines, and as a result, the stray capacitance of the bit lines to which the selected memory cells are connected can no longer be neglected with respect to the capacitance comprising the memory cells. In this case, considering, for example, the input of the data of the memory cell MC00 into the sense amplifier SA0, the slight potential change from the precharge potential, e.g., $\frac{1}{2} V_{CC}$, of the bit line $\overline{BL00}$, which is created corresponding to the data of the memory cell MC00, is compared with the precharge potential, e.g., $\frac{1}{2} V_{CC}$, of the opposing bit line BL00 by the sense amplifier SA0. As mentioned above, if the stray capacitance of the bit line to which the memory cell MC00 is connected is increased, such a small potential change cannot be satisfactorily produced.

Therefore, in the prior art, there has been proposed a shared bit line type semiconductor memory device wherein the bit lines are shared as mentioned above and, when the data of the memory cell connected to the outside bit line (for example, BL00 or $\overline{BL00}$) is input to a predetermined sense amplifier (for example, SA0), a control signal supplied to the bit line transfer BT1 connected to a predetermined peripheral circuit is used to turn ON bit line transfer gates (for example, Q00 and $\overline{Q00}$) and, on the other hand, a control signal supplied to the bit line transfer BT2 is used to turn OFF bit line transfer gates (for example, Q20 and $\overline{Q20}$) so that the stray capacitance of the inside bit line (for example, BL20 or $\overline{BL20}$) does not have an effect on the sense amplifier SA0, etc., (in the same way, when data of a memory cell connected to the inside bit line is input to a predetermined sense amplifier, the connection of the outside bit line is turned OFF so that the stray capacitance of the outside bit line does not have an effect on the sense amplifier). According, even if the capacitance of the memory cell itself is left as is, during a data read operation of the memory cell, the predetermined potential change at the bit line to which the memory cell is connected (and therefore the voltage difference with the opposing bit line) is ensured, and an accurate read operation of the data of the memory cell at the sense amplifier is made possible. Note that SAG is a ground potential supply line for driving the sense amplifiers (SA0 etc.), the sense amplifiers SA0, etc., being driven while the potential of the ground potential supply line SAG falls from, for example, $\frac{1}{2} V_{CC}$ to zero potential (low level) in accordance with the sense amplifier drive clock signal LE supplied to the predetermined drive circuit SD. In this case, the sense amplifiers are driven by the potential change of the SAG (to low level) at the time when the voltage difference is input into the sense amplifiers based on the above-mentioned potential change of the bit line.

FIGS. 2(a)–2(b) show the potential changes of various parts when predetermined data is written into all of the memory cells connected to a predetermined selected word line from a SAM type write data transfer means provided with the above-mentioned shift register, in which 2(a) shows the potential changes of portions when high level data is written into memory cells connected to the outside bit line BL0 (where BL0 includes the outside bit lines BL00, BL01, ... ) and having low level data and 2(b) shows the potential changes of portions when high level data is written into memory cells connected to the inside bit line BL2 (where BL2 includes the inside bit lines BL20, BL21, ... ) and having low level data. Note that in the figure, $\overline{BL0}$ includes the outside bit lines $\overline{BL00}$, $\overline{BL01}$, ... and $\overline{BL2}$ includes the inside bit lines $\overline{BL20}$, $\overline{BL21}$, ...and that further BL1 and $\overline{BL1}$ include the intermediate bit lines BL10, BL11, ... and $\overline{BL10}$, $\overline{BL11}$, ... , respectively.

As shown in the above-mentioned FIG. 2(a), when writing high level data into a memory cell (for example, MC00) connected to an outside bit line (for example, BL00) and having low level data, the potential of the outside bit line (BL00 etc.) is slightly changed to the low level side by the selection of a predetermined word line (in this case, WL0), the potential of the intermediate bit line (BL10 etc.) becomes low level during the high level state of the bit line transfer BT1, and a voltage difference occurs with the intermediate bit line ($\overline{BL10}$ etc.) At that time, the clock signal LE driving the sense amplifier is made high level (that is, the potential of the sense amplifier ground SAG is made low level), the sense amplifiers are driven, the voltage difference (shown by the dot-dash lines) arising on the intermediate bit lines is amplified, and then the potential of the bit line transfer BT2 becomes high level, and the voltage difference between the intermediate bit lines is transferred to the inside bit lines (BL20, $\overline{BL20}$, etc.) as shown by the broken lines. Then, the control signal WT of the transfer gate on the write data transfer side becomes high level, high level write data is transferred, and the potentials of the pair of inside bit lines change from the low level to high level and from the high level to the low level, respectively, as shown by the above broken lines. Further, the potential of the bit line transfer BT1 becomes high level, the potentials of the pair of inside bit lines are transferred to the pair of outside bit lines, and a data write operation is performed on the predetermined memory cell as shown by the solid line. Thereafter, the selected word line becomes nonselected and the potentials of the pair of outside bit lines return to the precharge potential.

In the same way, when writing high level data into a memory cell connected to an inside bit line (for example, BL20) and having low level data, the potential changes of the various parts are as shown in FIG. 2(b). Note that during this write operation, the potential of the bit line transfer BT1 remains at the low level and the potentials of the outside bit lines BL0, $\overline{BL0}$ remain at the precharge level.

The above enables, in a shared bit line type semiconductor memory device, predetermined data to be written from a SAM type write data transfer side into all of the memory cells connected to a predetermined selected word line. In other words, in the above case, predetermined data is written from each stage of the shift register into all of the memory cells connected to a predetermined selected word line through each pair of bit lines (through each column).

In this connection, in the above case, although, after the sense amplifiers are driven (i.e., after the potential of the SAG is made the low level), predetermined write data is transferred from each stage of the shift register to each pair of bit lines by making the control signal WT high level, it is also possible to transfer predetermined write data from each stage of the shift register to each pair of bit lines by making the control signal WT high level, and then drive the sense amplifiers. Namely, in the latter case, as the sense amplifiers are driven after the predetermined write data is transferred from each state of the shift register to each pair of bit lines, the amplified write data is written into all memory cells connected to a predetermined selected word line.

However, instead of writing data into all memory cells connected to a selected word line as above-mentioned, sometimes it is necessary to write data only into part of the memory cells connected to the selected word line. In this case, predetermined data is written from each stage of the shift register into only part of the memory cells connected to the selected word line by selecting one of a plurality of groups of pairs of bit lines (by selecting one of a plurality of groups of columns). In such a case, the data write operation can be performed only from each stage of the shift register to the memory cells connected to the selected one of the groups of columns and a read refresh operation is required for the memory cells connected to the remaining groups of the columns where the data write operation is not performed.

In more detail, when predetermined data is written from each stage of the shift register only into the above-mentioned part of the memory cells connected to the selected word line, if the sense amplifiers are driven after predetermined write data has been transferred from each stage of the shift register to the selected one of the groups of the columns where the data write operation is performed, cell data created at that time on the remaining groups of the columns where data write operation is not performed may be destroyed by noise, and thus incorrect data may be written into the memory cells connected to the above remaining groups of the columns when the corresponding word line is selected. Therefore, to avoid the above-mentioned problem, the above read refresh operation is required for the memory cells connected to the columns where the data write operation is not performed, by which read refresh operation data stored in the memory cells connected to the columns where the data write operation is not performed is once amplified by the corresponding sense amplifiers and then, the above amplified data is rewritten to each of the corresponding memory cell.

In this connection, essentially no problem arises in such a partial write operation for the selected part of memory cells connected to the selected word line and the selected one of groups of the pairs of inside bit lines. Namely, in this case, when a predetermined word line belonging to the inside bit lines is selected, the data stored in the memory cells connected to the selected word line is created on the corresponding column. At that stage, if, for example, high level data is transferred from each stage of the shift register to the memory cells having low level data through a selected one of groups of columns where the above partial write operation is performed, a predetermined slight potential difference due to the above high level data is created between each pair of inside bit lines corresponding to each of the columns where the above partial write operation is performed. Then, if the sense amplifiers are driven, the above potential difference is amplified and such amplified write data is written to each of the memory cells connected to the columns where the above partial write operation is performed. On the other hand, with regard to each of the remaining columns where the above partial write operation is not performed, a predetermined slight potential difference created on the corresponding column due to the corresponding cell data is amplified and the above read refresh operation is performed.

Thus, if only considering the above partial write operation into the part of memory cells belonging to the inside bit lines, essentially no problem arises even if the drive timing of the sense amplifiers belonging to the columns where the data write operation is performed is the same as the drive timing of the sense amplifiers belonging to the columns where the data write operation is not performed.

On the other hand, when the data write operation is carried out for the selected part of memory cells connected to the selected word line and the selected one of groups of the pairs of outside bit lines, it is necessary to turn ON the bit line transfer gates (Q20, $\overline{Q20}$, Q21, $\overline{Q21}$, and so on) by the control signal supplied to the bit line transfer BT2. However, if the above bit line transfer gates are turned ON in order to carry out the above partial write operation before the sense amplifiers are driven, it becomes difficult to create sufficient correct cell data on the corresponding pair of outside bit lines, and thus to amplify the cell data by using the sense amplifiers, due to the large stray capacitance including that of the inside and the outside bit lines which stray capacitance becomes can no longer be neglected with respect to the capacitance comprising each memory cell. Thus, it is necessary to create sufficient cell data on the corresponding pair of outside bit lines while the above bit line transfer gates are cut OFF, and thus the length of each pair of bit lines is reduced to a half so as to reduce the stray capacitance of each pair of bit lines to a half. In other words, it is necessary to turn ON the above bit line transfer gates by the control signal supplied to the bit line transfer BT2 after the cell data created on the corresponding pair of outside bit lines is amplified by the corresponding sense amplifiers, in order to prevent the destruction of the cell data (slight potential difference created between the corresponding pair of outside bit lines) corresponding to the columns where the data write operation is not performed (the read refresh operation is performed) by noise.

However, if the write data is transferred to the selected one of groups of columns where the data write operation is performed after the cell data created on the corresponding pair of outside bit lines is amplified by the corresponding sense amplifiers, a large potential difference due to the cell data has been created between the pair of outside bit lines through which the data write operation is performed, and thus the large potential difference is maintained on the columns where the data write operation is performed, even if the above bit line transfer gates are cut OFF after that time.

Therefore, in such a case, a problem arises in that it is necessary to provide a very large write amplifier on the write data transfer means side (i.e., the shift register side). Thus, in practice, and considering the requisite area, it has been impossible to perform the above-mentioned partial write operation, especially into part of the memory cells connected to the selected word line and the selected one of the groups of outside bit line pairs.

The present invention was made to solve the above problems. Thus, in the selected group of columns where write data is transferred, the drive timing of the sense amplifiers is delayed from the drive timing of the sense amplifiers in the nonwritten columns so as to perform the write data transfer operation before the drive of the sense amplifiers of the columns where the write data is transferred, or the drive of the sense amplifiers of the columns where the write data is transferred is stopped, whereby the write amplifier provided in the write data transfer means need not be that large, and further, the read refresh operation can be reliably performed without destruction of the cell data of the nonwritten columns.

Thus, when considering the partial write operation of the memory cells belonging to the selected one of the groups of outside bit lines, the sense amplifiers connected to the nonwritten columns are driven while the above bit line transfer gates are cut OFF by the control signal supplied to the bit line transfer BT2 (i.e., while the length of each pair of bit lines is reduced to a half). At that time, the selected group of sense amplifiers connected to the write data transfer columns is not yet driven, and thus a large voltage difference due to the corresponding cell data is not created in each of the columns through which the write data is transferred.

Then, the above bit line transfer gates are turned ON so as to transfer the write data from each stage of the shift register to each of the columns where the data write operation is performed. In this connection, with regard to the columns where the data write operation is not performed (i.e., the read refresh operation is performed), the cell data created on the corresponding columns has been already amplified by the corresponding sense amplifiers and a sufficient voltage difference has been already created in each of the nonwritten columns.

Then, the write data is transferred from each stage of the shift register to each of the columns where the data write operation is to be performed, and subsequently, the selected group of sense amplifiers connected to the columns where the write data has been transferred are driven, and thus the amplified write data is written to each of the memory cells connected to the columns where the data write operation is performed, and to the selected word line.

Thus, with regard to the memory cells belonging to the selected word line and the outside bit lines, the read refresh operation is ensured in each of the nonwritten columns, and the data write operation from the shift register is performed in each of the columns where the write data is to be transferred, without using such a large write amplifier on the write data transfer means side.

Thus, even when partially writing data in just memory cells connected to predetermined outside bit lines, the write amplifier provided in the write data transfer means need not be that large, and further, the read refresh operation of cell data of nonwritten columns can be reliably performed.

FIGS. 3A–3B show an example of a semiconductor memory device according to an embodiment of the present invention. In the above-mentioned shared bit line type semiconductor memory device, when a predetermined word line is selected, data can be written from the SAM write data transfer side (shift register side) into only part of the memory cells, among the memory cells connected to the word line, which are connected to a predetermined group of columns (bit lines). Namely, in the illustrated example, each of four bit line pairs (BL20, $\overline{BL20}$; BL21, $\overline{BL21}$; etc.) is connected through each of four pairs of transfer gates Q0, $\overline{Q0}$, Q1, $\overline{Q1}$; ..., each of which pairs is controlled by each potential of four control signal lines WT1 to WT4 each selected by each of output signals supplied from drive circuits SD1 to SD4, to each stage of the shift register SR provided in the SAM system. Accordingly, the write data transferred from each stage of the shift register is input to one of the four bit line pairs through predetermined transfer gates selected by each of output signals supplied from the drive circuits SD1 to SD4, whereby the above-mentioned partial write operation is performed.

Also, the outputs of a decoder circuit S are supplied to the respective sense amplifier drive circuits SD1 to SD4. In this connection, in the circuit shown in FIGS. 3A–3B, two address bit signals AD1 and AD2 are input to the decoder circuit S, which supplies high level output signals for selectively driving one of the drive circuits SD1 to SD4 (e.g., SD1) in accordance with potentials of the input address bit signals AD1 and AD2. Further, the sense amplifier drive clock LE and write signal WT are supplied to the sense amplifier drive circuits SD1 to SD4.

Figure 4A:
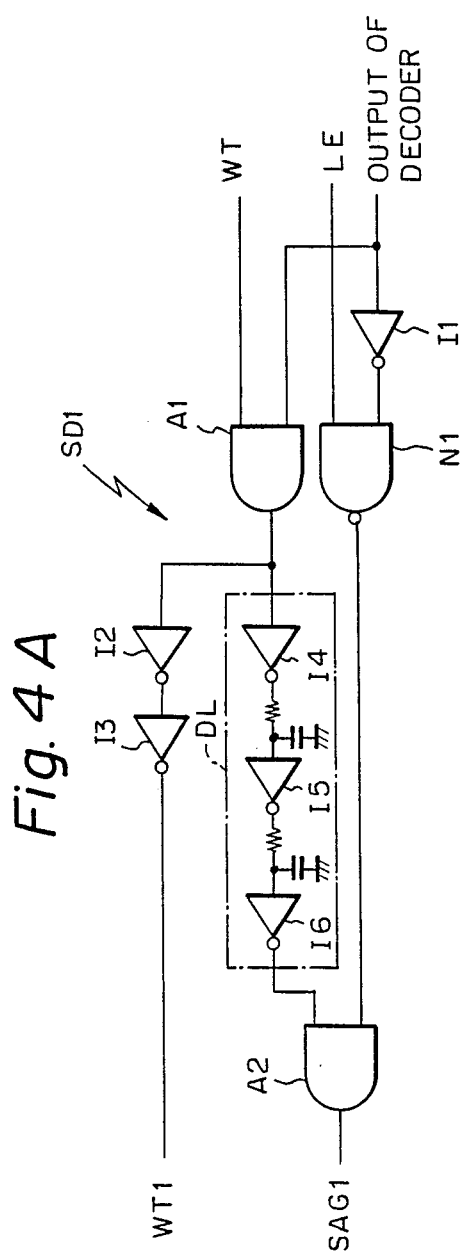
FIG. 4A and FIG. 4B show an example of concrete circuit diagram of a drive circuit shown in FIGS. 3A–3B and a timing chart explaining the operation thereof, respectively.
Figure 4B:
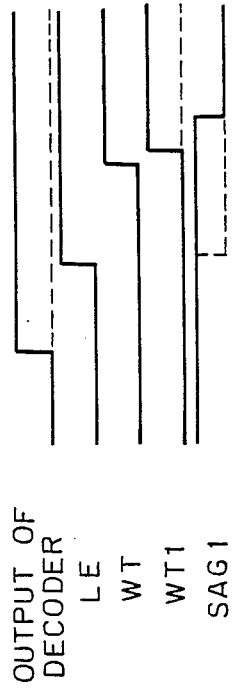

FIG. 4A shows an example of the drive circuit SD1 and FIG. 4B shows a timing chart explaining the operation of the circuit SD1. When the potential of the output signal supplied from the decoder circuit S to the drive circuit SD1 becomes high level, the output signal of an AND gate A1 becomes high level when the potential of the write signal WT becomes high level, and thus the potential of the control signal line WT1 for turning ON the transfer gates Q0, $\overline{Q0}$, and so on, which signal line WT1 is connected to the output side of the AND gate A1 through inverters I2 and I3, becomes high level as shown in FIG. 4B.

In this connection, in the other drive circuits SD2 to SD4 (i.e., the drive circuits corresponding to the non-written columns), as the potential of the output signal supplied from the decoder circuit S is low level, the potentials of the control signal lines WT2 to WT4 are low level, even if the potentials of the write signal WT becomes high level, as shown by the dotted line instead of the solid line representing the potential of the selected signal line WT1 in FIG. 4B.

Further, when the potential of the signal supplied from the decoder circuit S to the drive circuit SD1 becomes high level (i.e., is made low level by an inverter I1), the output signal of a NAND gate N1 becomes high level, even if the potential of the sense amplifier drive clock LE becomes high level. Also, the above high level output signal of the AND gate A1 is inverted to a low level signal and supplied to an AND gate A2 through a delay circuit DL including inverters I4 to I6, resistors, and capacitors. Thus, the timing by which the potential of the sense amplifier ground SAG1 supplied from the output side of the AND gate A2 becomes low level (i.e., the timing by which the corresponding sense amplifiers are driven) is delayed by the delay time produced in the delay circuit DL, as shown by the solid line SAG1 in FIG. 4B.

In this connection, in the other drive circuits SD2 to SD4 (i.e., the drive circuits corresponding to the non-written columns), as the potential of the output signal supplied from the decoder circuit S is low level and is made high level by the inverter I1, the output signal of the NAND gate N1 becomes low level when the potential of the clock LE becomes high level. Thus, the potentials of the sense amplifier grounds SAG2 to SAG4 immediately become low level and the corresponding sense amplifiers connected to the non-selected columns are immediately driven, as shown by the dotted line instead of the above solid line representing the potential of the sense amplifier ground SAG1 in FIG. 4B.

Namely, the timing by which the potential of the selected control signal line (e.g., WT1) becomes high level is set to occur after the potentials of the sense amplifier grounds (e.g., SAG2 to SAG4) for driving the sense amplifiers connected to the nonwritten columns become low level, and conversely, before the potential of the sense amplifier ground (e.g., SAG1) for driving the sense amplifiers connected to the write data transfer columns becomes low level.

The circuit for creating this condition is not limited to the above circuit, i.e., it is sufficient that the timing of the potentials of WT1 to WT4 and SAG1 to SAG4 become as above. Note that, in the semiconductor memory device shown in FIGS. 3A–3B, portions corresponding to FIGS. 1A–1B are given the same reference symbols as FIGS. 1A–1B.

FIGS. 5(a)–(b) show the potential changes of various portions in a semiconductor memory circuit shown in FIGS. 3A–3B when predetermined data is written from a SAM type write data transfer side provided with the above-mentioned shift register through predetermined transfer gates, e.g., Q0, $\overline{Q0}$, to memory cells (for example, MC00) connected to a predetermined selected word line and part of the outside bit lines (for example, BL00), wherein 5(a) shows the potential changes of various portions when writing high level data into memory cells connected to outside bit lines, for example, BL00, on which data writing is being performed, and having low level data and 5(b) shows the potential changes of various portions related to the outside bit lines, for example, BL01, on which data writing is not being performed (that is, on which a read refresh operation is performed).

That is, as shown in the above-mentioned FIG. 5(a), when writing high level data in memory cells (for example, MC00) connected to outside bit lines (for example, BL00) and having low level data, the selection of a predetermined word line WL (in this case, WL0) first results in a fine change of the potential of the outside bit lines (BL00 etc.) and the intermediate bit lines (BL10, etc.) to the low level side in accordance with the cell data.

On the other hand, even on the outside bit line BL01 side where the data write operation is not being performed, as shown in FIG. 5(b), the selection of the word line WL first results in the transfer of the low level potential created on the outside bit line BL01 (cell data) to the intermediate bit line BL11 because, as mentioned above, the potential of the bit line transfer BT1 becomes high level.

Then, the potential of the bit line transfer BT1 is made low level and next the potentials of the sense amplifier grounds (e.g., SAG2) for driving the sense amplifiers connected to the nonwritten columns are made low level, whereby the corresponding sense amplifiers (for example, SA1) are driven and the potentials of the intermediate bit lines (BL11, $\overline{BL11}$) are amplified (see dot-chain lines in FIG. 5(b)). At that time, as the potential of the bit line transfer BT2 is low level, the inside bit lines are disconnected from the outside bit lines. Namely, in the nonwritten columns, the sense amplifiers are driven while the length of each pair of bit lines is reduced to a half, to reduce the stray capacitance of each pair of bit lines. Thus, it is possible to prevent the cell data created on the corresponding nonwritten columns from being destroyed by noise, and to ensure a correct read refresh operation. Next, the potential of the bit line transfer BT2 is made high level, the potentials of the inside bit lines (BL21, $\overline{BL21}$) become equal to the potentials of the intermediate bit lines (BL11, $\overline{BL11}$), (see broken lines), and then the potential of the bit line transfer BT1 is again made high 1 and the potentials of the inside bit lines (BL21, $\overline{BL21}$) are transferred to the outside bit lines (BL01, $\overline{BL01}$) for the read refresh operation on predetermined memory cells. In this connection, the potential of the bit line transfer BT1 may be maintained at the high level instead of the above potential change.

After the potential of the bit line transfer BT2 is made high level, with respect to the bit lines on which data writing is performed, as shown in FIG. 5(a), the potential of the control signal line WT1 which controls the conductance of the corresponding transfer gates (for example, Q0, $\overline{Q0}$) is made high level, whereby the high level data is transferred to the corresponding group of columns. Accordingly, the potentials of the inside bit lines (for example, BL20, $\overline{BL20}$) and intermediate bit lines (for example, BL10, $\overline{BL10}$) on which the write data is transferred change in accordance with the writing high level data (see broken lines of FIG. 5(a)).

Then, the potential of the sense amplifier ground (e.g., SAG1) for driving the sense amplifiers connected to the columns where the data write operation is performed is made low level, and thus the data write operation can be performed from the shift register to the predetermined memory cells, without using a large write amplifier on the write data transfer means side.

In this case, with respect to the bit lines on which write data is being transferred, the drive timing of the corresponding sense amplifiers is delayed until after the completion of the transfer operation of the write data, whereby provision of a large write amplifier is no longer necessary. Note that the drive of the sense amplifiers in the write data transfer columns amplifies the write data in a supplementary manner and is not necessarily required. As explained later, in the write data transfer columns, the drive of the sense amplifiers may be stopped, instead of delaying the drive timing thereof, as above-mentioned.

Subsequently, by making the potential of the bit line transfer BT1 high level, the potentials of the intermediate bit lines (BL10, $\overline{BL10}$) are transferred to the outside bit lines (BL00, $\overline{BL00}$), whereby, as shown by the solid line in FIG. 5(a), the potential of the outside bit line BL00 to which the memory cell MC00 is connected changes from low level to high level in accordance with data to be written into the memory cell MC00. Further, the potential of the outside bit line $\overline{BL00}$ of the opposing side changes from high level to low level, and subsequently, the potential of the word line WL is made low level and the potentials of the bit lines are returned to the precharge level.

Further, FIGS. 6(a)–6(b) show the potential changes of various portions when writing predetermined data from the SAM system write data transfer side provided with the above-mentioned shift register to the memory cells connected to the predetermined selected word line and part of the inside bit lines (for example, BL20) through the above-mentioned predetermined transfer gates, for example, Q0, $\overline{Q0}$, wherein 6(a) shows the potential changes of various portions when writing high level data into memory cells connected to inside bit lines, for example, BL20, on which data writing is being performed, and having low level data and 6(b) shows the potential changes of various portions related to the inside bit lines, for example, BL21, on which data writing is not being performed (that is, on which a read refresh operation is performed).

That is, as shown in the above-mentioned FIG. 6(a), when writing high level data in memory cells connected to the inside bit lines (for example, BL20) and having low level data, the selection of a predetermined word line WL first results in a fine change of the potentials of the inside bit lines (BL20 etc.) and the intermediate bit lines (BL10 etc.) to the low level side in accordance with the cell data. (Note that, at this time, the potential of the bit line transfer BT2 is made high level.)

On the other hand, even on the inside bit line BL21 side where the data write operation is not being performed, as shown in FIG. 6(b), the selection of the word line WL first results in a transfer of the low level potential created on the inside bit line BL21 (cell data) to the intermediate bit line BL11 due, as mentioned above, to the potential of the bit line transfer BT2 becoming high level.

In this state, the potential of the bit line transfer BT2 is once made low level and next the potentials of the sense amplifier grounds (e.g., SAG2) for driving the sense amplifiers connected to the nonwritten columns are made low level, whereby the corresponding sense amplifiers (for example, SA1) are driven and the potentials of the intermediate bit lines (BL11, $\overline{BL11}$) are amplified (see dot-chain lines in FIG. 6(b)). Next, the potential of the bit line transfer BT2 is again made high level, the potentials of the inside bit lines (BL21, $\overline{BL21}$) become equal to the potentials of the intermediate bit lines (BL11, $\overline{BL11}$) (see broken line), and the refresh operation is performed on predetermined memory cells. In this connection, the potential of the bit line transfer BT2 may be maintained at the high level instead of the above potential change.

On the other hand, with respect to the bit lines on which data writing is performed, as shown in FIG. 6(a), the potential of the control signal line WT1 which controls the conductance of the corresponding transfer gates (for example, Q0, $\overline{Q0}$) is made high level, whereby high level data is written. Accordingly, the potential of the inside bit line BL20 (and intermediate bit line BL10) changes in accordance with the write data from low level to high level for writing data into the predetermined memory cells. Further, the potential of the inside bit line $\overline{BL20}$ on the opposing side changes from high level to low level. Then, the potential of the word line WL is made low level and the potentials of the bit lines are returned to the precharge level.

In this case, with respect to the inside bit lines on which write data is being transferred, the timing by which the potential of the sense amplifier ground (e.g. SAG1) for driving the sense amplifiers connected to the write data transfer columns is made low level (i.e., the drive timing of the corresponding sense amplifiers) is delayed until after the completion of the transfer operation of the write data as shown in FIG. 6(a), or the drive of the corresponding sense amplifiers may be stopped-as in the case of the above-mentioned outside bit lines. Thus, it is possible to simplify the entire construction of the circuit by commonly using the drive circuits SD1 to SD4.

However, when writing the write data into part of the memory cells connected to inside bit lines, the drive timing of the sense amplifiers of the write data transfer columns (i.e., the timing by which the potential of the corresponding sense amplifier ground (e.g., SAG1) is made low level) can be the same as that of the sense amplifiers of the nonwritten columns (i.e., the timing by which the potential of the corresponding sense amplifier ground (e.g., SAG2) is made low level).

In this connection, although, in the case shown in FIG. 6(b), the potentials of the sense amplifier grounds (e.g., SAG2) are made low level before the data write operation (i.e., before the potential of the control signal line WT1 is made high level as shown in FIG. 6(a)), it is also possible to make the potentials of all sense amplifier grounds SAG1 to SAG4 low level after the data write operation, and thus to perform the data write operation without using a large write amplifier on the write data transfer means side.

By doing this and selectively setting to the high level the potential of each of the control signal lines WT1 to WT4 which control the ON/OFF state of the corresponding transfer gates, predetermined write data is simultaneously transferred from each stage of the shift register through the corresponding transfer gates to part of the memory cells connected to a predetermined word line.

Further, as another embodiment of the present invention, instead of delaying the drive timing of the sense amplifiers connected to the shared bit lines for which write data is being transferred, as in the case of the above-mentioned FIG. 3A-3B, a similar effect can be obtained by stopping the drive of the sense amplifiers connected to the shared bit lines for which the write data is being transferred. In this case, instead of the drive circuit including the delay circuit DL, provision may be made of a circuit which stops the potential of the sense amplifier ground (e.g., SAG1) from being made low level generated by the selected drive circuit (e.g., SD1).

The operation and potential changes of the various parts in this case are substantially the same as the case explained by the above-mentioned FIGS. 5(a)-5(b) and FIGS. 6(a)-6(b), and similar effects are exhibited.

According to the present invention, in a shared bit line type semiconductor memory device, even when writing data partially on only memory cells connected to a selected one of groups of the outside bit lines from an SAM type write data transfer means, the write data transfer means side does not require a large write amplifier. Further, a read refresh operation of cell data of nonwritten columns can be reliably performed.

We claim:

1. A semiconductor memory device comprising:
   a write data transfer means;
   a plurality of groups of sense amplifiers;
   a plurality of word lines;
   a plurality of pairs of bit lines, each of said pairs of bit lines comprising a pair of inside bit line portions extending between said write data transfer means and each of said sense amplifiers, and a pair of outside bit line portions extending from each of said sense amplifiers in a direction opposite to that of a corresponding pair of inside bit line portions;
   a plurality of memory cells connected between said word lines and said pairs of bit lines, respectively; and
   delaying means for delaying a drive timing of a selected one of said groups of sense amplifiers connected to a selected one of said pairs of bit lines on which a transfer of write data is being performed, the drive timing being a delayed drive timing when compared with the drive timing of the sense amplifiers connected to remaining pairs of said bit lines on which the transfer of said write data is not being performed, said delaying means delaying the drive timing when the write data is transferred from said write data transfer means to part of the memory cells connected to a selected one of said outside bit line portions connected to said selected one of said groups of sense amplifiers.

2. A semiconductor memory device according to claim 1, wherein said write data is transferred from said write data transfer means to said selected one of said pairs of bit lines connected to said selected one of said groups of sense amplifiers after the drive timing of the sense amplifiers connected to said remaining pairs of bit lines on which the transfer of said write data is not being performed and conversely before the drive timing of said selected one of said groups of sense amplifiers connected to said selected one of said pairs of bit lines on which the transfer of said write data is being performed.

3. A semiconductor memory device according to claim 1, wherein said delaying means comprises a plurality of drive circuits each driving corresponding one of said groups of sense amplifiers, and a decoder means for selecting one of said drive circuits for driving corresponding one of said groups of sense amplifiers, a selected one of the drive circuits delaying a timing of an output signal for driving said selected one of said groups of sense amplifiers connected to said selected one of said pairs of bit lines on which the transfer of said write data is being performed, said timing being a delayed timing when compared with the timing of the output signal for transferring the write data from said write data transfer means to said selected one of said pairs of bit lines connected to said selected one of said groups of sense amplifiers, the timing being delayed when said one of the drive circuits is selected by said decoder means.

4. A semiconductor memory device according to claim 1, further comprising:
   a pair of first transfer gates connected between each pair of said outside bit lines portions and each of said sense amplifiers, said pair of first transfer gates being controlled by a first control signal, and
   a pair of second transfer gates connected between each of said sense amplifiers and each pair of said inside bit line portions, said pair of second transfer gates being controlled by a second control signal.

5. A semiconductor memory device according to claim 4, wherein said sense amplifiers connected to said pairs of bit lines on which the transfer of said write data is not being performed, are driven while said pair of second transfer gates are cut OFF by said second control signal.

6. A semiconductor memory device according to claim 4, wherein said write data is transferred from said write data transfer means to said pairs of inside bit line portions connected to said selected one of said groups of sense amplifiers while said pair of first transfer gates are cut OFF by said first control signal.

7. A semiconductor memory device according to claim 1, wherein said delaying means also delays the driving timing of said selected one of said groups of sense amplifiers connected to said selected one of said pairs of bit lines on which the transfer of said write data is being performed, said drive timing being a delayed drive timing when compared with the drive timing of the sense amplifiers connected to said remaining pairs of bit lines on which the transfer of said write data is not being performed, said delaying means delaying the driving timing even when the write data is transferred from said write data transfer means to a part of memory cells connected to a selected one of inside bit line portions connected to said selected one of said groups of sense amplifiers.

8. A semiconductor memory device according to claim 1, wherein said write data transfer means is a shift register.

9. A semiconductor memory device comprising:
   a write data transfer means;
   a plurality of groups of sense amplifiers;
   a plurality of word lines;
   a plurality of pairs of bit lines, each of said pairs of bit lines comprising a pair of inside bit line portions extending between said write data transfer means and each of said sense amplifiers, and a pair of outside bit line portions extending from each of said sense amplifiers in a direction opposite to that of a corresponding pair of inside bit line portions;

a plurality of memory cells connected between said word lines and said pairs of bit lines, respectively; and drive stopping means for stopping a drive of a selected one of said groups of sense amplifiers connected to a selected one of said pairs of bit lines on which a transfer of write data is being performed, the drive stopping means stopping the drive when the write data is transferred from said write data transfer means to a part of the memory cells connected to a selected one of said bit lines connected to said selected one of said groups of sense amplifiers.

10. A semiconductor memory device according to claim 9, further comprising:

a pair of first transfer gates connected between each pair of said outside bit line portions and each of said sense amplifiers, said pair of first transfer gates being controlled by a first control signal, and a pair of second transfer gates connected between each of said sense amplifiers and each pair of said inside bit line portions, said pair of second transfer gates being controlled by a second control signal.

11. A semiconductor memory device according to claim 10, wherein said sense amplifier, connected to said pairs of bit lines on which the transfer of said write data is not being performed, are driven while said pair of second transfer gates are cut OFF by said second control signal.

12. A semiconductor memory device according to claim 10, wherein said write data is transferred from said write data transfer means to said pairs of inside bit line portions connected to said selected one of said groups of sense amplifiers while said pair of first transfer gates are cut OFF by said first control signal.

13. A semiconductor memory device according to claim 9, wherein said write data transfer means is a shift register.

* * * * *